United States Patent
McKinnell et al.

(10) Patent No.: US 7,184,193 B2
(45) Date of Patent: Feb. 27, 2007

(54) SYSTEMS AND METHODS FOR AMORPHOUS FLEXURES IN MICRO-ELECTRO MECHANICAL SYSTEMS

(75) Inventors: James McKinnell, Salem, OR (US); Arthur R. Piehl, Corvallis, OR (US); James R. Przybyla, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 10/958,707

(22) Filed: Oct. 5, 2004

(65) Prior Publication Data

US 2006/0072187 A1 Apr. 6, 2006

(51) Int. Cl.
- *G02B 26/00* (2006.01)
- *H01L 21/00* (2006.01)
- *H01L 29/84* (2006.01)
- *H01L 31/00* (2006.01)
- *H01L 31/0232* (2006.01)

(52) U.S. Cl. .............. 359/291; 359/290; 359/321; 438/48; 438/50; 438/52; 438/482; 257/415; 257/432; 257/448

(58) Field of Classification Search ........ 359/290–298, 359/224, 321; 353/98, 99; 257/414, 415, 257/448, 432, 444; 216/2; 430/50; 333/262, 333/105; 521/78; 438/48, 52, 50, 53, 482, 438/485
See application file for complete search history.

(56) References Cited

U.S. PATENT DOCUMENTS

| | | | | |
|---|---|---|---|---|
| 3,542,545 A * | 11/1970 | Goffe | ............ | 430/50 |
| 5,485,304 A * | 1/1996 | Kaeriyama | ............ | 359/291 |
| 5,552,924 A * | 9/1996 | Tregilgas | ............ | 359/224 |
| 5,696,619 A * | 12/1997 | Knipe et al. | ............ | 359/224 |
| 5,745,281 A * | 4/1998 | Yi et al. | ............ | 359/290 |
| 5,942,054 A | 8/1999 | Tregilgas et al. | | |
| 6,078,233 A * | 6/2000 | Misumi et al. | ............ | 335/128 |
| 6,275,326 B1 * | 8/2001 | Bhalla et al. | ............ | 359/298 |
| 6,794,725 B2 * | 9/2004 | Lemmi et al. | ............ | 257/448 |
| 6,960,971 B2 * | 11/2005 | Park et al. | ............ | 333/262 |
| 7,057,251 B2 * | 6/2006 | Reid | ............ | 257/432 |
| 7,144,750 B2 * | 12/2006 | Ouellet et al. | ............ | 438/50 |
| 2002/0047172 A1 * | 4/2002 | Reid | ............ | 257/415 |
| 2002/0163349 A1 | 11/2002 | Wada et al. | | |
| 2003/0036215 A1 * | 2/2003 | Reid | ............ | 438/52 |
| 2005/0239231 A1 * | 10/2005 | Przybyla et al. | ............ | 438/48 |

FOREIGN PATENT DOCUMENTS

JP 9-126833 5/1997

OTHER PUBLICATIONS

John H Tregilgas "Amorphous Titanium aluminide Hinge", Advanced Materials & Processes, Oct. 2004, pp. 40-41.
Linder et al, "Ternary Ta-Si-N films for sensors and actuators", Sensors and Actuators A 61 (1997), pp. 387-391.

* cited by examiner

*Primary Examiner*—Loha Ben (57) ABSTRACT

A micro-electro mechanical system includes a flexure, wherein the flexure is made of an amorphous material. Similarly, a method for forming a micro-electro mechanical system includes forming a substrate, and forming an amorphous flexure, the amorphous flexure being coupled to the substrate.

43 Claims, 7 Drawing Sheets

SYSTEMS AND METHODS FOR AMORPHOUS FLEXURES IN MICRO-ELECTRO MECHANICAL SYSTEMS

BACKGROUND

Various types of micro-electro mechanical systems (MEMS) are known. Such devices perform a number of functions including, but in no way limited to, switches, actuators, and light modulators. MEMS functioning as spatial light modulators (SLMs) include pixels formed of electrically addressable, deflectable mirrors or reflectors. SLMs are transducers capable of modulating incident light in correspondence to an electrical and/or optical input. SLMs are capable of modulating the incident light in phase, intensity, polarization, and/or direction.

Additionally, MEMS may function as Fabry-Perot light modulators. Fabry-Perot light modulators include parallel mirrors. One of the parallel mirrors is modulated to change the gap between the mirrors. The gap between the mirrors determines the wavelengths which will be allowed to exit the device.

In general, MEMS typically include a deflectable or movable mass or surface coupled to a substrate by a resiliently deformable member, such as a flexure or a spring. The resiliently deformable members typically position the deflectable or movable mass, such as a reflective surface or mirror, in a neutral position. The neutral position may be parallel or not parallel to a coupled substrate. The resiliently deformable member will keep the deflectable or movable mass in the neutral position until the selective application of attractive electrostatic forces or repulsive forces due to some other means, causes a deflection thereof. In the context of SLMs, even slight deflections of the mirrors or other reflectors may dramatically alter the modulation of light incident thereon.

Movement of a movable mass deforms the resiliently deformable members, storing potential energy therein. The stored potential energy tends to return the deflectable or movable mass to its neutral position once the electrostatic force is removed. The resiliently deformable members are known to deform in a cantilever mode, in a torsional mode, or in a combination of both modes known as the flexure mode.

Repeated deflection of traditional resiliently deformable members results in a phenomenon known as creep. Creep is a relaxation or deformation of the resiliently deformable members that results in improper operation of the MEMS. For example, a relaxed resiliently deformable member may be incapable of returning a deflectable or movable mass to its proper neutral position when electrostatic forces are removed, resulting in changed or degraded performance of the MEMS over time, such as unintended modulation of light.

SUMMARY

A micro-electro mechanical system includes a flexure, wherein the flexure is made of an amorphous material.

Similarly, a method for forming a micro-electro mechanical system includes forming a substrate, and forming an amorphous flexure, the amorphous flexure being coupled to the substrate.

BRIEF DESCRIPTION OF THE DRAWINGS

The accompanying drawings illustrate various embodiments of the present system and method and are a part of the specification. The illustrated embodiments are merely examples of the present system and method and do not limit the scope thereof. The summary as well as other features and aspects of the present system and method will become apparent upon reading the following detailed description and upon reference to the drawings in which.

Throughout the drawings, identical reference numbers designate similar, but not necessarily identical, elements.

DETAILED DESCRIPTION

The present specification describes a system and a method for reducing the creep paths available in a MEMS device. More specifically, by forming a MEMS having amorphous flexures, crystalline slip planes and grain boundaries are eliminated from the flexure structure, thereby removing two significant paths for creep to occur. The following specification and claims disclose exemplary embodiments of systems and methods for forming amorphous flexures in a MEMS device.

As used in this specification and the appended claims, the term "Micro-Electro Mechanical System" or "MEMS" is meant to be understood broadly as describing any very small (micro) mechanical device that may typically be constructed on one or more semiconductor chips and which may be fabricated using integrated circuit (IC) batch-processing techniques. MEMS may be broadly classified as sensors, actuators, a combination of sensors and actuators, light modulators, or added circuitry for processing or control. For the purposes of present specification and appended claims, the term MEMS is meant to refer to any of the above-mentioned classes.

Additionally, as used in the present specification and in the appended claims, the term "crystalline" is meant to be understood as the traditional structure of metals and metal alloys characterized by a number of repeating structure patterns that may result in a number of crystalline slip planes or grain boundaries. "Crystalline slip planes" are crystallographic planes along which dislocation motion occurs between repeating three-dimensional atom or molecule arrays, often resulting in creep of a structural member. Similarly, the term "grain boundaries" refers to interfaces separating two adjoining crystals having different crystallographic orientations in a polycrystalline metal or ceramic.

Further, the term "amorphous" is meant to be understood as referring to any solid form material having an essentially noncrystalline atomic structure. A material having an amorphous atomic structure is substantially devoid of crystalline slip planes and grain boundaries, thereby enhancing the material properties when compared to similar crystalline materials.

In the following specification, for purposes of explanation, numerous specific details are set forth in order to provide a thorough understanding of the present system and method for forming amorphous flexures in a MEMS device. It will be apparent, however, to one skilled in the art, that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Referring now to the Figures, FIGS. 1 through 5 illustrate a number of MEMS structures that include the use of one or more flexures that have traditionally been affected by creep. Consequently, the present system and method may be incorporated into the MEMS structures illustrated in FIGS. 1 through 5. While the Figures and the following detailed description make reference to light modulating MEMS, the present systems and methods may be incorporated into any MEMS configuration susceptible to creep.

Figure 1:
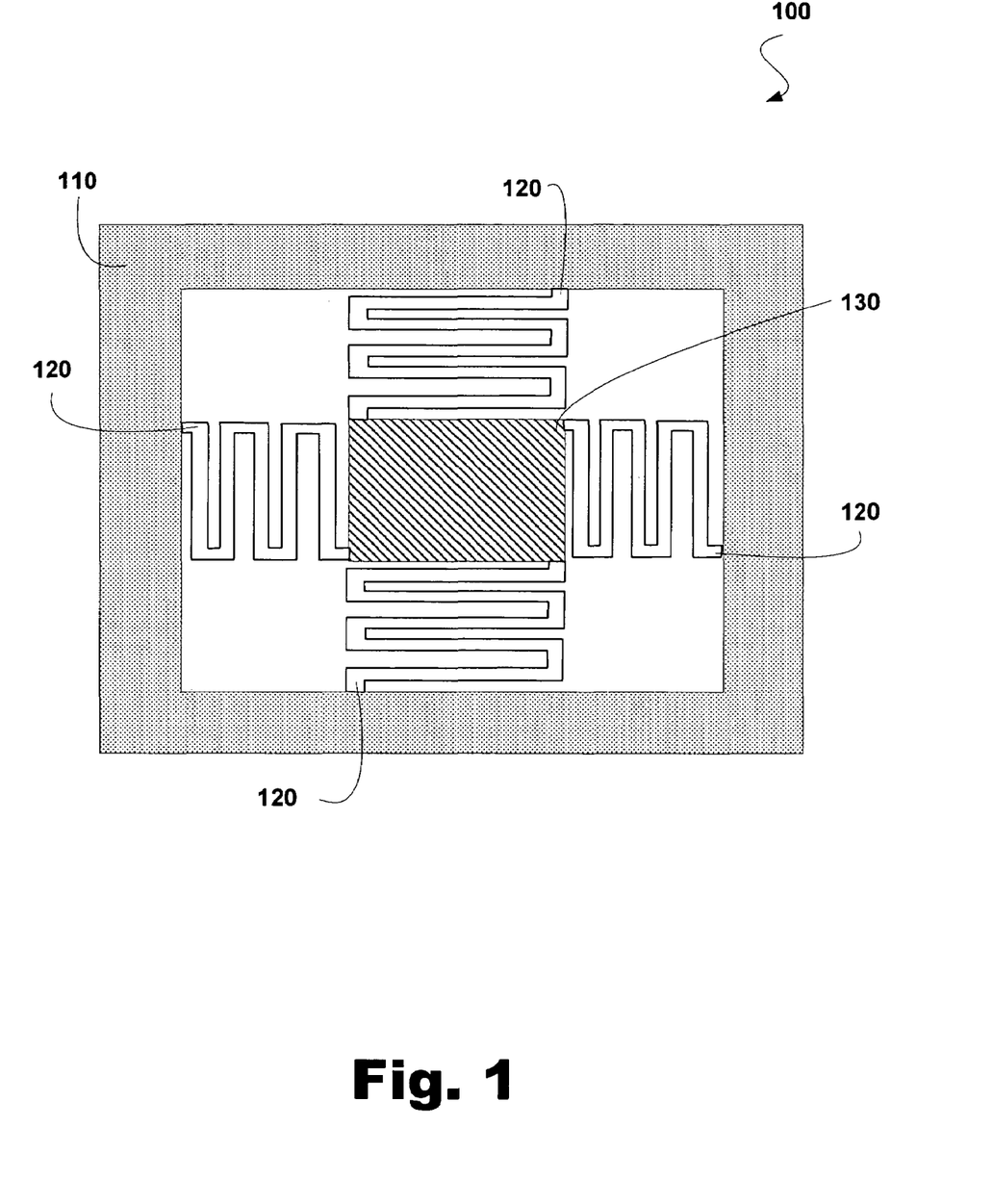
FIG. 1 is a top view illustrating a serpentine flexure MEMS, according to one exemplary embodiment.

FIG. 1 is a top view illustrating a serpentine flexure MEMS (100), according to one exemplary embodiment. As shown in FIG. 1, the present exemplary serpentine flexure MEMS (100) includes a substrate (110) coupled to a first end of a plurality of amorphous flexures (120) fashioned in a serpentine configuration. The amorphous flexures (120) are each coupled on a second end to a stepper motor platform (130). According to the exemplary embodiment illustrated in FIG. 1, the stepper motor platform (130) is suspended above the substrate (110) by the amorphous flexures (120). Additionally, the amorphous flexures (120), illustrated in FIG. 1 allow for controlled in-plane motion of the stepper motor platform (130). In other words, the amorphous flexures (120) illustrated in FIG. 1 allow for the stepper motor platform (130) to be selectively translated along the plane parallel with the substrate (110). The introduction of creep in one or more of the amorphous flexures (120) may produce out-of-plane motion of the stepper motor platform (130). Additionally, creep in one or more of the amorphous flexures (120) may prevent the stepper motor platform (130) from returning to its original position in the plane.

Figure 2:
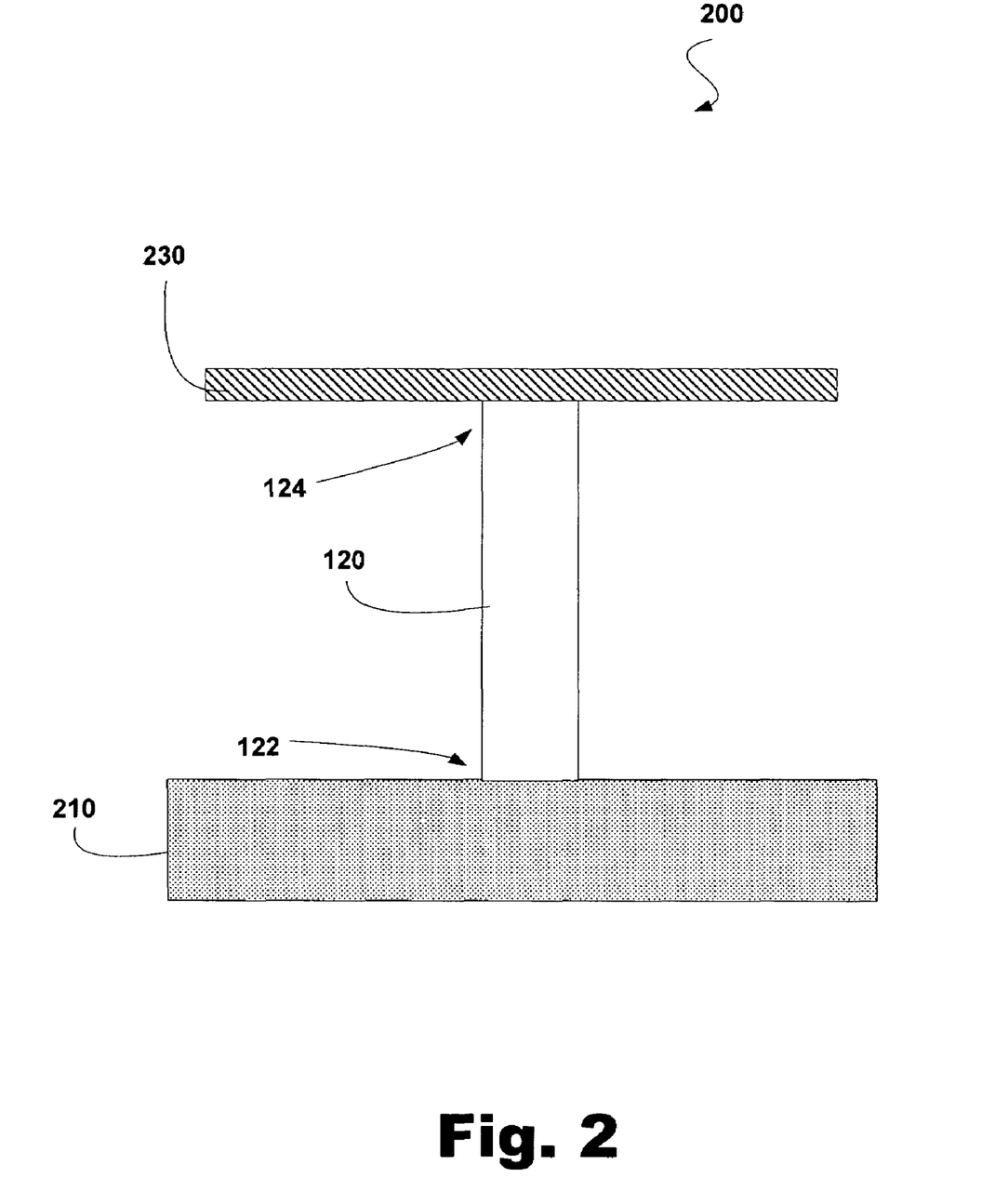
FIG. 2 is a side view illustrating the components of an SLM incorporating a simple post flexure MEMS, according to one exemplary embodiment.

In contrast to the in-plane motion MEMS illustrated in FIG. 1, FIG. 2 is a side view illustrating the components of a spatial light modulator (SLM) incorporating a simple post flexure MEMS (200) that provides out-of-plane motion, according to one exemplary embodiment. As shown in the exemplary embodiment illustrated in FIG. 2, the post flexure MEMS (200) includes a substrate (210) having a first end (122) of an amorphous flexure (120) vertically coupled thereto. Additionally, the second end (124) of the amorphous flexure (120) is subsequently coupled to a light modulator (230), thereby initially positioning the light modulator (230) parallel with respect to the substrate (210). According to one exemplary embodiment, a number of control electrodes (not shown) produce an electrostatic force causing an out-of-plane movement of the light modulator (230) about the amorphous flexure (120), thereby deforming the amorphous flexure and storing energy therein. When the electrostatic force is removed, the energy stored within the amorphous flexure (120) returns the light modulator (230) to its neutral position parallel to the substrate (210). The introduction of creep to the amorphous flexure (120) may cause improper operation or failure of the spatial light modulator (SLM) illustrated in FIG. 2 by inhibiting the proper positioning of the light modulator (230).

Figure 3:
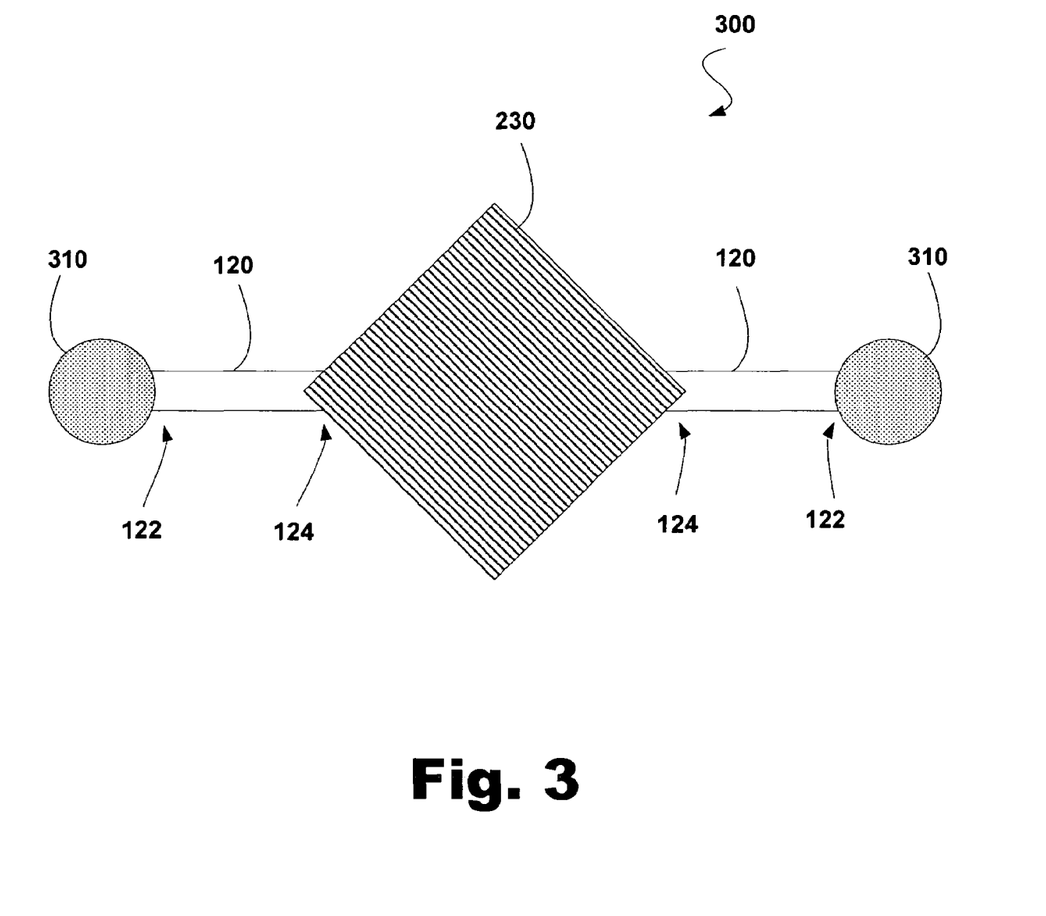
FIG. 3 is a top view illustrating an SLM incorporating a torsional flexure MEMS, according to one exemplary embodiment.

FIG. 3 is a top view illustrating an SLM incorporating a torsional flexure MEMS (300), according to one exemplary embodiment. Similar to FIG. 2, the torsional flexure MEMS (300) illustrated in FIG. 3 includes a light modulator (230) coupled to a plurality of amorphous flexures (120) on opposing ends of the light modulator (230). The light modulator is coupled to the second end (124) of each amorphous flexure (120). The first end (122) of each of the amorphous flexures (120) is coupled to an anchor post (310). The exemplary configuration illustrated in FIG. 3 allows the light modulator (230) to be selectively tilted out of plane by a torsional flexure of the amorphous flexures (120), when an electrostatic force is produced by a number of control electrodes (not shown). This out-of-plane tilting of the light modulator (230) will occur about the connection points of the amorphous flexures (120) to the light modulator (230). Consequently, the tilting of the light modulator (230) may be controllably varied to modulate light incident to the light modulator. The inherent sensitivity of light modulation makes creep especially dangerous to the proper function of SLMs. If creep is induced into the flexures (120) of the SLM, the location of a pixel's image may shift.

Figure 4A:
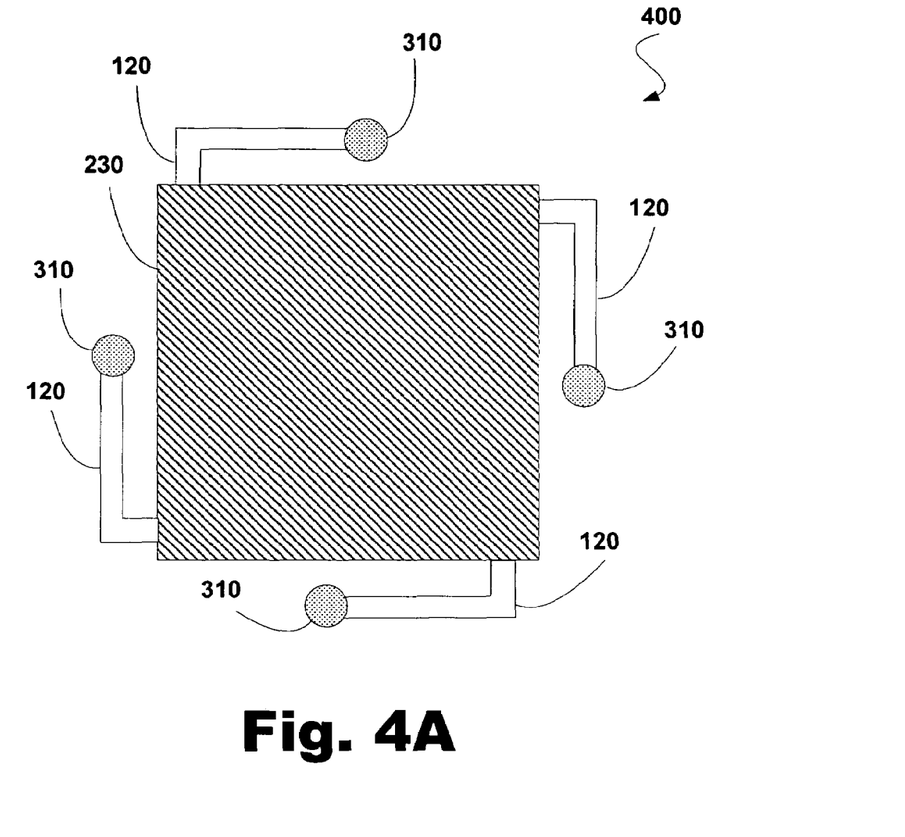
FIGS. 4A, 4B, and 4C are various views of an SLM incorporating a pinwheel flexure MEMS, according to one exemplary embodiment.
Figure 4B:
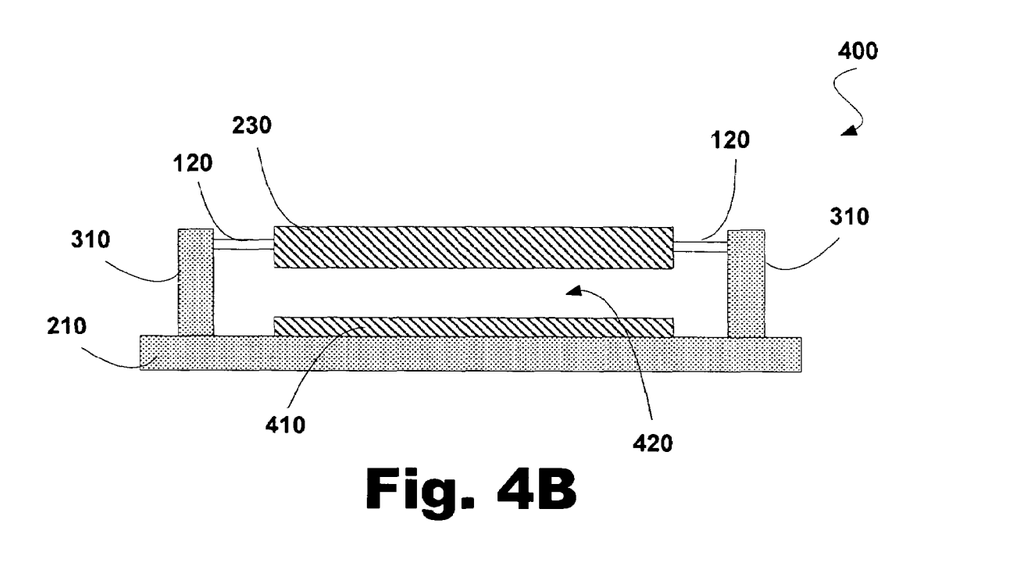

FIGS. 4A and 4B illustrate a top and a partial cutaway side view respectively of an SLM incorporating a pinwheel flexure MEMS (400) that may function as a Fabry-Perot light modulator. As illustrated in FIG. 4B, the pinwheel flexure MEMS (400) that functions as a Fabry-Perot light modulator is a reflection device, including a highly reflective fixed mirror (410) coupled to the substrate (210). A low reflective light modulator (230) is suspended adjacent to the fixed mirror (410) by a plurality of anchor posts (310) extruding from the substrate (210). Additionally, a plurality of amorphous flexures (120) couple the low reflective light modulator (230) to the anchor posts (310) in a pinwheel configuration as illustrated in FIG. 4A.

Figure 4C:
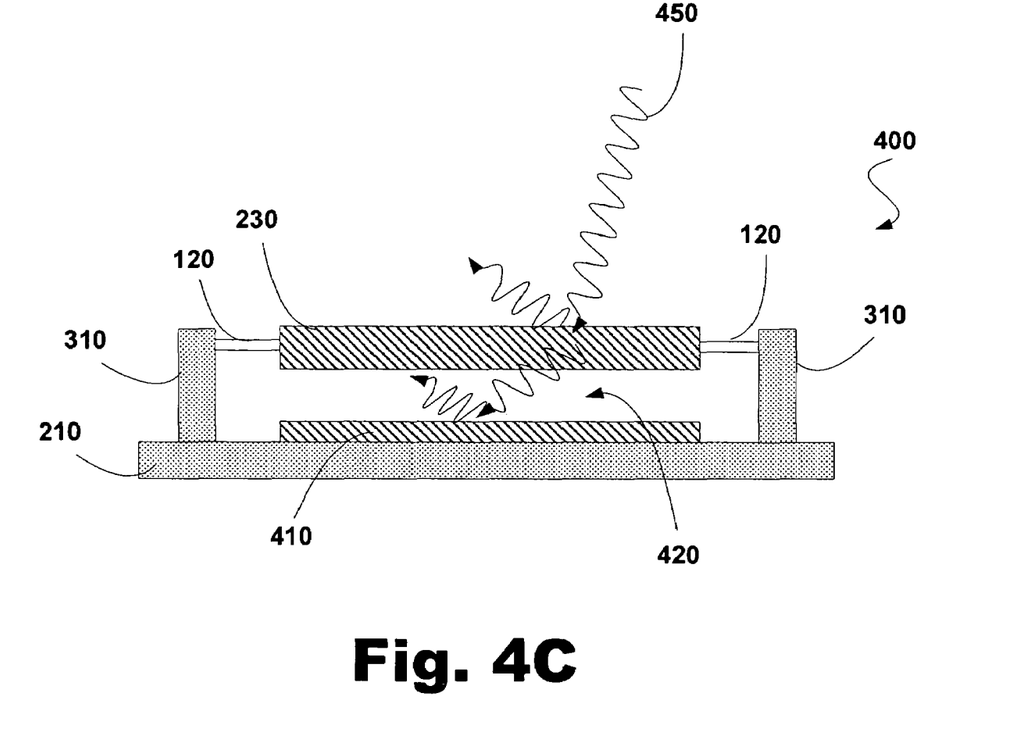

During operation, as illustrated in FIG. 4C, a beam of light (450) incident on the light modulator (230) will undergo partial reflection off the front light modulator, followed by a reflection off the back fixed mirror (410). The beam of light (450) subsequently bounces inside the cavity (420). Each round trip through the cavity (420) will result in some transmission through the low reflectivity top light modulator. Electrostatic deflection of the light modulator (230) may be performed by a number of control electrodes (not shown) to selectively vary the cavity (420) dimensions. This selective variation of the cavity (420) also varies the wavelengths which will be allowed out of the cavity, resulting in a selective cancellation of portions of the reflected beam of light (450). Due to the need for a high degree of control of the cavity (420) dimensions, creep in the amorphous flexures (120) of the pinwheel flexure MEMS (400) may prevent proper or total function of the Fabry-Perot light modulator by improperly shifting the colors of a displayed image.

Figure 5:
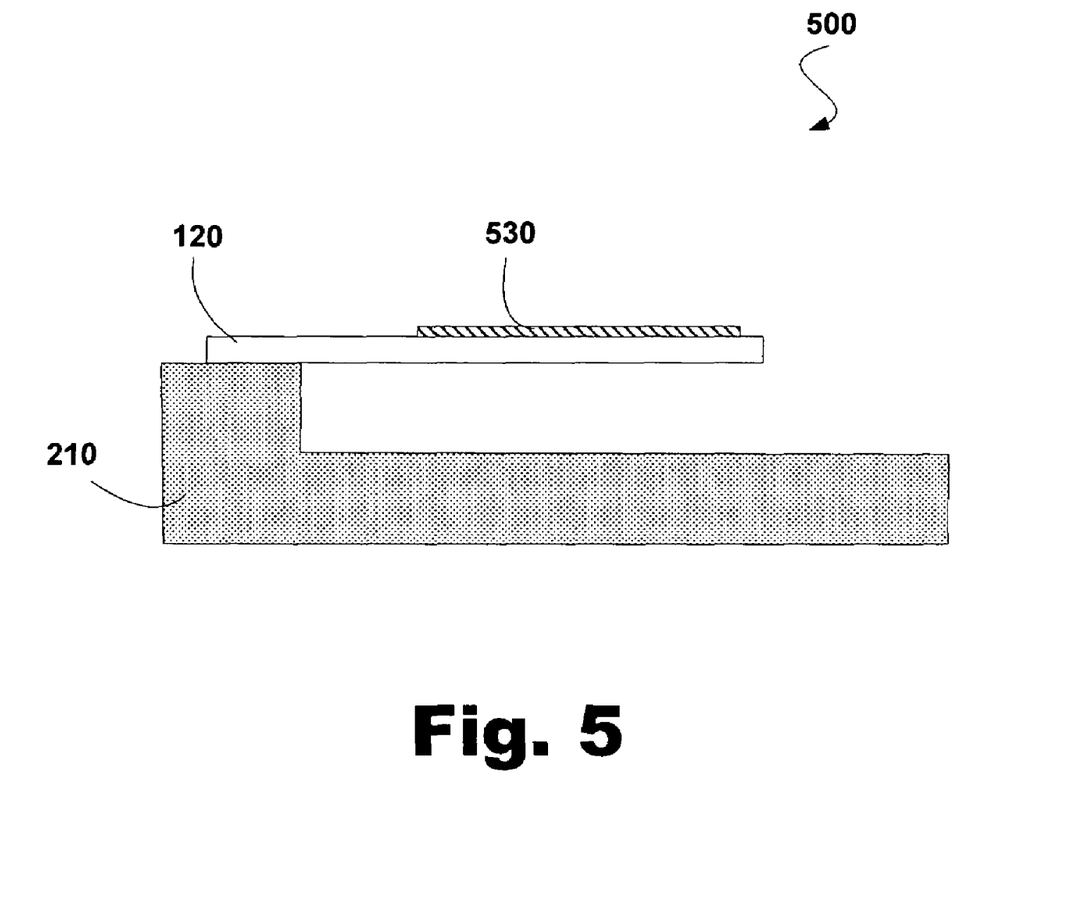
FIG. 5 is a side view illustrating a vibrating reed sensor incorporating a cantilevered flexure MEMS, according to one exemplary embodiment.

FIG. 5 is a side view illustrating a vibrating reed sensor incorporating a cantilevered flexure MEMS (500), according to one exemplary embodiment. As illustrated in FIG. 5, a proof mass (530) is coupled to the cantilevered amorphous flexure (120), which is in turn coupled to the substrate (210). A proof mass (530) is a predetermined test mass used in a measuring device or machine, such as in acceleration measurement equipment that serves as the reference mass for a quantity to be measured. Similar to the exemplary embodiments illustrated above, the introduction of creep into the amorphous flexure (120) would prevent the proper positioning of the proof mass (530).

As noted above, the MEMS structures illustrated in FIGS. 1 through 5 include amorphous flexures (120). The use of amorphous flexures (120) in place of traditional flexures reduces the likelihood of creep in the flexures, thereby reducing the likelihood of shifting in the neutral position of the flexure and preserving the performance of the light modulators.

Several mechanisms have been identified as contributing to the creep phenomena including, stress induced vacancy diffusion, dislocation motion, grain boundary diffusion, and grain boundary sliding. Forming the flexures of an amorphous material minimizes the flexure creep propagated by the above-mentioned creep phenomena by eliminating the crystalline structure that leads to the creep phenomena.

Figure 6:
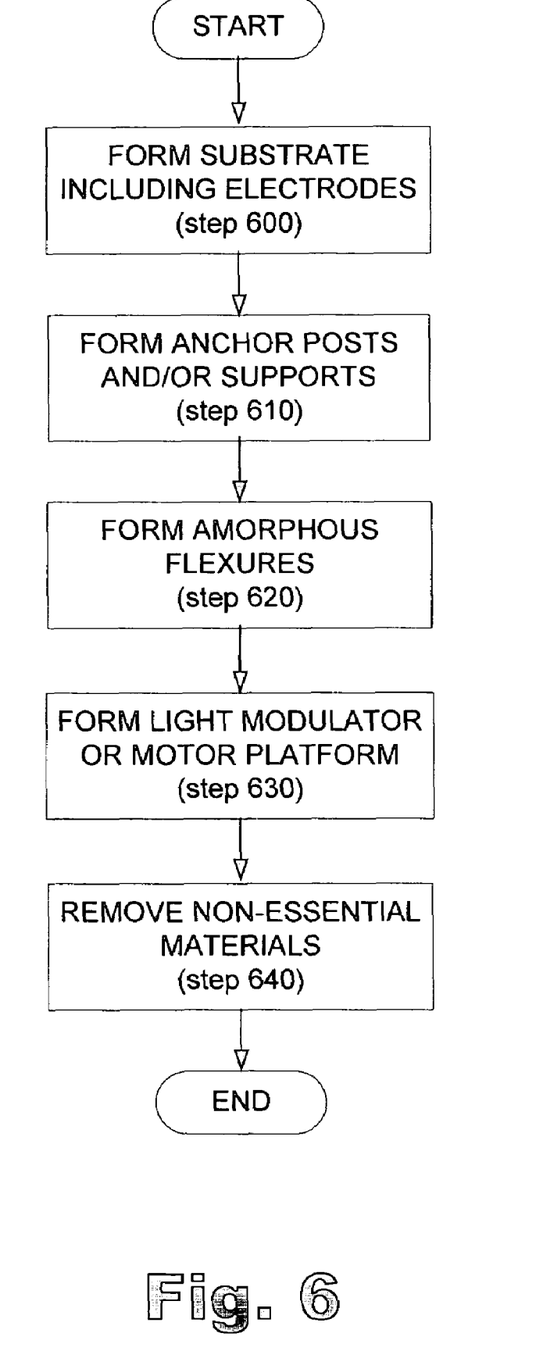
FIG. 6 is a flow chart illustrating a method for forming an amorphous flexure member, according to one exemplary embodiment.

FIG. 6 illustrates an exemplary method for forming a MEMS in which the MEMS flexures are formed of an amorphous material. While FIG. 6 illustrates one exemplary method, the steps are only illustrative and in actual fabrication of a MEMS, several of the steps might overlap, be combined, and/or be reordered as known in the art. According to the exemplary embodiment illustrated in FIG. 6, the method begins by forming the underlying substrate including electrodes (step 600). Once the substrate has been formed, anchor posts and/or other supports may be formed on the substrate (step 610). Subsequently, the amorphous flexures may be formed (step 620) followed by the formation of any light modulators and/or motor platforms (step 630). Once formed, the non-essential materials may be removed (step 640) to complete the formation of the desired MEMS structure. Further details of the above-mentioned method will be given below.

As shown in FIG. 6, the exemplary method begins by forming a substrate including electrodes (step 600). Formation of the substrate and electrodes may be performed according to any one of known formation methods including, but in no way limited to, growing a layer of thermal oxide on a silicon substrate and/or sputter depositing an aluminum alloy or an aluminum copper alloy (Al—Cu) onto the thermal oxide layer followed by a pattern and plasma etch process to define the electrodes.

Next, according to the exemplary embodiment illustrated in FIG. 6, the anchor posts and/or supports are formed (step 610). According to one exemplary embodiment, the anchor posts and/or supports may be formed using any number of deposition methods currently known in the art including, but in no way limited to, sputtering of an aluminum alloy or an aluminum copper alloy (Al—Cu). Moreover, the formation of the posts and/or supports may be aided by the use of photoresist and/or any number of sacrificial support materials.

Once the anchor posts and/or supports are formed, the amorphous flexures may be formed (step 620). According to a first exemplary embodiment, the amorphous flexures are formed by sputter deposition of tantalum aluminum (TaAl) alloys containing between 1% and 99% atomic percent aluminum. According to one exemplary embodiment, the tantalum aluminum (TaAl) alloys contain between 35% and 65% atomic percent Tantalum. The amorphous state is a mixture of materials akin to a quenched liquid phase with no discernable structure in X-ray or electron beam diffraction.

Alternatively, the amorphous flexures may be formed by a number of amorphous metal alloys, or metallic glass alloys, and deposition methods. Currently known deposition methods that may be used to form the amorphous flexures include, but are in no way limited to physical vapor deposition (PVD) methods such as co-sputtering, reactive sputtering, reactive co-sputtering, evaporation, pulsed laser deposition, ion beam methods, electronic-beam techniques, chemical vapor deposition (CVD), plasma enhanced chemical vapor deposition (PECVD), and atomic layer deposition (ALD). Moreover, amorphous films that may be used to form the amorphous flexures include, but are in no way limited to, zirconium vanadium iron alloy (ZrVFe), a zirconium vanadium titanium alloy (ZrVTi), a cobalt gold alloy (CoAu), or a gold silicon alloy (AuSi), and bulk-solidifying amorphous alloys, such as those commercially known as LIQUIDMETAL®, produced by Liquidmetal Technologies.

Moreover, the amorphous flexures formed according to the exemplary method illustrated in FIG. 6 may be formed by depositing a plurality of crystalline films in a single or multiple layer stack and annealing the stack to form an amorphous material. The amorphous material may be formed from the crystalline films through solid state reaction as in the case of nickel-zirconium (Ni—Zr) and silicon-titanium (Si—Ti) systems.

Once the amorphous flexures are formed (step 620), a light modulator, a proof mass, a motor platform, or another desired component that is configured to interact with the amorphous flexures may be formed thereon (step 630).

After all of the desired components have been formed, the exemplary method illustrated in FIG. 6 continues by removing any non-essential materials (step 640). Throughout the formation process, a number of releases, resists, spacers, and/or protective layers may be used. These materials may be removed from the resulting structure using any number of known methods including, but in no way limited to, chemically dissolving, etching, thermal removal, etc.

In conclusion, the present system and method reducing the creep paths available in a MEMS device. More specifically, by forming a MEMS having amorphous flexures, crystalline slip planes and grain boundaries are eliminated from the flexure structure, thereby removing two significant paths for creep to occur. This reduction in the likelihood of creep to affect MEMS flexures improves the reliability and accuracy of many MEMS applications.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A micro-electro mechanical system comprising:
a micro-electro mechanical system component configured to be selectively deflected from a neutral position to at least one deflected position; and
a flexure supporting said component, wherein said flexure flexes to selectively deflect said component from said neutral position to said at least one deflected position; wherein said flexure is made of an amorphous material comprising tantalum.

2. The micro-electro mechanical system of claim 1, wherein said component comprises a light modulator.

3. The micro-electro mechanical system of claim 2, wherein said light modulator comprises a Fabry-Perot light modulator.

4. The micro-electro mechanical system of claim 1, wherein said amorphous material comprises one of an amorphous metal, an amorphous metal alloy, or a plurality of amorphous metal alloy layers.

5. The micro-electro mechanical system of claim 1, wherein said amorphous material comprises a tantalum aluminum alloy (TaAl).

6. The micro-electro mechanical system of claim 5, wherein said tantalum aluminum alloy comprises between 1 and 99 atomic percent aluminum.

7. The micro-electro mechanical system of claim 5, wherein said tantalum aluminum alloy comprises between 35 and 65 atomic percent tantalum.

8. The micro-electro mechanical system of claim 1, wherein said amorphous material is substantially devoid of crystalline slip planes and grain boundaries.

9. The micro-electro mechanical system of claim 1, wherein said flexure further comprises an amorphous film.

10. The micro-electro mechanical system of claim 9, wherein said amorphous film comprises a bulk-solidifying amorphous alloy.

11. The micro-electro mechanical system of claim 1, wherein said flexure comprises one of a serpentine flexure or a pinwheel flexure.

12. A microelectro mechanical system comprising:
a micro-electro mechanical system component comprising a light modulator that is configured to be selectively deflected from a neutral position to at least one deflected position; and
a flexure supporting said component, wherein said flexure flexes to selectively deflect said component from said neutral position to said at least one deflected position;
wherein said flexure is made of an amorphous material; and
wherein said light modulator comprises a Pabry-Perot light modulator.

13. A micro-electro mechanical system comprising:
a micro-electro mechanical system component configured to be selectively deflected from a neutral position to at least one deflected position; and
a flexure supporting said component, wherein said flexure flexes to selectively deflect said component from said neutral position to said at least one deflected position;
wherein said flexure is made of an amorphous material comprising one of a zirconium vanadium iron alloy (ZrVFe), a zirconium vanadium titanium alloy (ZrVTi), a cobalt gold alloy (CoAu), or a gold silicon alloy (AuSi).

14. The micro-electro mechanical system of claim 13, wherein said flexure is configured as one of a serpentine flexure or a pinwheel flexure.

15. A micro-electro mechanical system comprising:
a micro-electro mechanical system component configured to be selectively deflected from a neutral position to at least one deflected position; and
a flexure supporting said component, wherein said flexure flexes to selectively deflect said component from said neutral position to said at least one deflected position;
wherein said flexure is made of an amorphous material comprising a previously crystalline film that has been annealed to induce a solid state reaction rendering said film amorphous.

16. The system of claim 15, wherein said film comprises nickel-zirconium (Ni—Zr) or silicon-titanium (Si—Ti).

17. A micro-electro mechanical system comprising:
a micro-electro mechanical system component; and
a flexure connected to said component, wherein said flexure is made of an amorphous material;
wherein said flexure comprises a pinwheel flexure.

18. A micro-electro mechanical system comprising:
a substrate;
a flexure coupled to said substrate; and
a light modulator coupled to said flexure;
wherein said flexure is an amorphous material substantially devoid of crystalline slip planes and grain boundaries, said amorphous material comprising tantalum.

19. The micro-electro mechanical system of claim 18, wherein said amorphous material comprises one of an amorphous metal, an amorphous metal alloy, a plurality of amorphous metal alloy layers, or a plurality of amorphous metal layers.

20. The micro-electro mechanical system of claim 18, wherein said amorphous material comprises a tantalum aluminum (TaAl) alloy between 1 and 99% atomic percent aluminum.

21. The micro-electro mechanical system of claim 18, wherein said flexure comprises one of a serpentine flexure or a pinwheel flexure.

22. A flexure comprising an amorphous material;
said flexure being configured to support a component of said a micro-electra mechanical system;
further comprising one of an amorphous metal, an amorphous metal alloy, a plurality of amorphous metal alloy layers, or a plurality of amorphous metal layers;
wherein said metal, alloy, plurality of alloy layers or plurality of metal layers comprise tantalum.

23. The flexure of claim 22, wherein said flexure comprises a tantalum aluminum (TaAl) alloy.

24. The flexure of claim 22, wherein said flexure comprises an alloy of between approximately 1 and 99 atomic percent aluminum.

25. The flexure of claim 22, wherein said flexure comprises an alloy of between 35 and 65 atomic percent tantalum.

26. The flexure of claim 22, wherein said flexure is configured as one of a serpentine flexure or a pinwheel flexure.

27. A method of forming a micro-electro mechanical system comprising:
forming a substrate;
forming an amorphous flexure comprising tantalum, said amorphous flexure being coupled to said substrate; and
forming a component of said micro-electro mechanical system that is deflectably supported by said flexure.

28. The method of claim 27, wherein said step of forming an amorphous flexure comprises sputter depositing a tantalum aluminum alloy (TaAl).

29. The method claim 27, wherein said step of forming an amorphous flexure comprises depositing an amorphous film onto said substrate using a physical vapor deposition method.

30. The method of claim 29, wherein said physical vapor deposition method comprises one of a co-sputtering deposition, a reactive sputtering deposition, a reactive co-sputtering evaporation deposition, a pulsed laser deposition, an ion beam deposition, an electron beam deposition, and electronic-beam deposition, a chemical vapor deposition, a plasma enhanced chemical vapor deposition, a plasma enhanced chemical vapor deposition, or an atomic layer deposition.

31. The method of claim 27, further comprising forming a light modulator, said light modulator being coupled to said amorphous flexure.

32. A method of forming a micro-electro mechanical system comprising:
forming a substrate;
forming an amorphous flexure, said amorphous flexure being coupled to said substrate; and
forming a component of said micro-electro mechanical system that is deflectably supported by said flexure;
wherein said amorphous film comprises one of a tantalum aluminum alloy (TaAl), a zirconium vanadium iron alloy (ZrVFe), a zirconium vanadium titanium alloy (ZrVTi), a cobalt gold alloy (CoAu), a gold silicon alloy (AuSi), or a bulk-solidifying amorphous alloy.

33. A method of forming a micro-electra mechanical system comprising:
forming a substrate;
forming an amorphous flexure, said amorphous flexure being coupled to said substrate; and
forming a component of said micro-electro mechanical system that is deflectably supported by said flexure;
wherein said step of forming an amorphous flexure comprises:
depositing a plurality of crystalline films onto said substrate; and
annealing said crystalline films to induce a solid state reaction in said crystalline films;
wherein said solid state reaction causes said crystalline films to assume amorphous structures.

34. The method of claim 33, wherein said plurality of crystalline films comprise one of a nickel-zirconium (Ni—Zr) or a silicon-titanium (Si—Ti) system.

35. A micro-electro mechanical system comprising:
a component of said micro-electro mechanical system configured to be selectively moved between a neutral position and at least one deflected position; and
a means for flexing that supports said component and flexes to selectively move said component between said neutral position and said at least one deflected position;
wherein said means for flexing is made of an amorphous material comprising tantalum.

36. The micro-electro mechanical system of claim 35, wherein said component comprises a means for modulating light.

37. The micro-electro mechanical system of claim 36, wherein said means for modulating light comprises a Fabry-Perot light modulator.

38. The micro-electro mechanical system of claim 35, wherein said amorphous material comprises one of an amorphous metal, an amorphous metal alloy, or a plurality of amorphous metal alloy layers.

39. The micro-electro mechanical system of claim 35, wherein said amorphous material comprises a tantalum aluminum alloy (TaAl) devoid of crystalline slip planes and grain boundaries.

40. The micro-electro mechanical system of claim 39, wherein said tantalum aluminum alloy comprises between 1 and 99% atomic percent aluminum.

41. The micro-electra mechanical system of claim 35, wherein said amorphous material comprises a previously crystalline film that has been annealed.

42. The micro-electro mechanical system of claim 35, wherein said means for flexing comprises one of a serpentine flexure, a post flexure, a torsional flexure, or a pinwheel flexure.

43. A micro-electro mechanical system comprising:
a component of said micro-electro mechanical system configured to be selectively moved between a neutral position and at least one deflected position; and
a means for flexing that supports said component and flexes to selectively move said component between said neutral position and said at least one deflected position;
wherein said means for flexing is made of an amorphous material;
wherein said means for flexing further comprises an amorphous film including one of a zirconium vanadium iron alloy (ZrVFe), a zirconium vanadium titanium alloy (ZrVTi), a cobalt gold alloy (CoAu), a gold silicon alloy (AuSi), or a LIQUID METAL.

* * * * *

UNITED STATES PATENT AND TRADEMARK OFFICE
CERTIFICATE OF CORRECTION

PATENT NO. : 7,184,193 B2
APPLICATION NO. : 10/958707
DATED : February 27, 2007
INVENTOR(S) : McKinnell et al.

It is certified that error appears in the above-identified patent and that said Letters Patent is hereby corrected as shown below:

Col. 8 (line 23), delete "micro-electra" and insert therefor --micro-electro--.

Signed and Sealed this

Eighteenth Day of September, 2007

JON W. DUDAS
*Director of the United States Patent and Trademark Office*